US010392695B2

(12) United States Patent
Yuan

(10) Patent No.: US 10,392,695 B2
(45) Date of Patent: Aug. 27, 2019

(54) SPUTTERING APPARATUS

(71) Applicant: BOE Technology Group Co., Ltd., Beijing (CN)

(72) Inventor: Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 233 days.

(21) Appl. No.: 15/105,090

(22) PCT Filed: Jul. 17, 2015

(86) PCT No.: PCT/CN2015/084309

§ 371 (c)(1),
(2) Date: Jun. 16, 2016

(87) PCT Pub. No.: WO2016/155150

PCT Pub. Date: Oct. 6, 2016

(65) Prior Publication Data

US 2017/0137932 A1 May 18, 2017

(30) Foreign Application Priority Data

Mar. 27, 2015 (CN) .......................... 2015 1 0142748

(51) Int. Cl.
*C23C 14/54* (2006.01)
*C23C 14/34* (2006.01)
(Continued)

(52) U.S. Cl.
CPC .............. *C23C 14/54* (2013.01); *C23C 14/34* (2013.01); *C23C 14/3407* (2013.01);
(Continued)

(58) Field of Classification Search
CPC ............... H01J 37/342; H01J 37/32449; H01J 37/3244; C23C 14/54; C23C 14/34;
(Continued)

(56) References Cited

U.S. PATENT DOCUMENTS

2007/0256933 A1* 11/2007 Yoon .................. H01J 37/3423 204/298.12
2011/0079508 A1* 4/2011 Bender ............... H01J 37/3405 204/192.12
2013/0228452 A1* 9/2013 De Bosscher ........ C23C 14/352 204/192.12

FOREIGN PATENT DOCUMENTS

CN 103882397 A * 3/2014 ............. C23C 14/35
CN 103882397 A 6/2014
(Continued)

OTHER PUBLICATIONS

Machine Translation of CN 103882397 A (Year: 2014).*
(Continued)

*Primary Examiner* — Rodney G McDonald
(74) *Attorney, Agent, or Firm* — Westman, Champlin & Koehler, P.A.

(57) ABSTRACT

The present invention discloses a sputtering apparatus, which relates to technical field of vacuum coating and seeks to solve a problem of low yield of devices manufactured by a sputtering apparatus. The sputtering apparatus includes, a vacuum chamber in which a substrate and a plurality of rotatable target materials facing to the substrate are provided. A distance between any two adjacent target materials is in a range from 160 mm to 220 mm. The sputtering apparatus provided by the present invention is used to improve yield of the devices manufactured by the sputtering apparatus.

16 Claims, 4 Drawing Sheets

(51) Int. Cl.
*C23C 14/56* (2006.01)
*H01J 37/34* (2006.01)

(52) U.S. Cl.
CPC ........ *C23C 14/3464* (2013.01); *C23C 14/542* (2013.01); *C23C 14/562* (2013.01)

(58) Field of Classification Search
CPC ............ C23C 14/3407; C23C 14/3464; C23C 14/542; C23C 14/562
USPC ............. 204/192.12, 298.07, 298.21, 298.22
See application file for complete search history.

(56) References Cited

FOREIGN PATENT DOCUMENTS

| | | |
|---|---|---|
| CN | 103993275 A | 8/2014 |
| CN | 203846099 U | 9/2014 |
| CN | 104694892 A | 6/2015 |
| KR | 10-2013-0045489 A | 5/2013 |

OTHER PUBLICATIONS

Rejection Decision for Chinese Patent Application No. 201510142748.X, dated Mar. 13, 2017, 8 pages.
Second Office Action for Chinese Patent Application No. 201510142748.X, dated Dec. 8, 2016, 9 pages.
First Office Action, including Search Report, for Chinese Patent Application No. 201510142748.X, dated May 30, 2016, 7 pages.
International Search Report and Written Opinion for International Application No. PCT/CN2015/084309, dated Jan. 15, 2016, 11 pages.
English translation of Box No. V of the Written Opinion of the International Searching Authority for International Application No. PCT/CN2015/084309, dated Jan. 15, 2016, 2 pages.

* cited by examiner

SPUTTERING APPARATUS

CROSS-REFERENCE TO RELATED APPLICATION

This application is a Section 371 National Stage Application of International Application No. PCT/CN2015/084309, filed on 17 Jul. 2015, entitled “Sputtering Apparatus”, which has not yet published, and which claims priority to Chinese Application No. 201510142748.X, filed on 27 Mar. 2015, incorporated herein by reference in their entirety.

BACKGROUND OF THE INVENTION

Field of the Invention

The present invention relates to a technology field of film plating in vacuum, and particularly to a sputtering apparatus.

Description of the Related Art

Sputter coating technology is widely applied in flat panel display field, semiconductor field and solar energy field, etc. due to its simple process, convenient operation, and density of the obtained film and high combination strength. A sputtering apparatus is used to perform a sputtering, in the sputter coating technology. The used sputtering apparatus includes a vacuum chamber, in which a substrate and target materials are provided. The working principle of the sputtering apparatus is to supply certain process gas to the vacuum chamber where an electrical field is provided therein to ionize the process gas as plasma, which in turn hits the rotatable target materials under the action of the electrical field such that particles on the surface of the target material are sputtered out of the target materials and are attached to the surface of the substrate, thereby achieving the film.

However, the inventor has found that the sputtering apparatus in prior art is configured such that the rotatable target materials each is set to have a large rotation angle in order to make sure that the coating produced by the sputtering apparatus has a uniform thickness. In this instance, particles sputtered from a same target material travel rather significant different distances and arrive at different locations of the substrate and thus contents of the process gas at different locations of the film, which is formed of particles through the sputtering, are different. Thus, different portions of the film exhibit different characteristics, which renders a device containing the coating deteriorate, or even failure, and thereby decreases yield of the devices manufactured by the sputtering apparatus.

SUMMARY OF THE INVENTION

It is an object of the present invention to provide a sputtering apparatus in order to improve yield of the devices manufactured by the sputtering apparatus.

In order to achieve the object, embodiments of the present invention provide a sputtering apparatus comprising: a vacuum chamber in which a substrate and a plurality of rotatable target materials facing to the substrate are provided, wherein a distance between any adjacent two of the target materials is in a range from 160 mm to 220 mm.

Further, the target materials are hollow target materials, and, a rotating magnetic pole, which allows each of the target materials to rotate left-right by an angle in a range from 30° to 80° with relative to the substrate, is provided in a central region of each of the target materials.

Further, there are thirteen target materials provided in the vacuum chamber, wherein, the distance between any adjacent two of the target materials is 208 mm±10 mm, and the target materials each are rotatable left-right by an angle in a range from 50° to 80° with relative to the substrate.

Further, there are fourteen target materials provided in the vacuum chamber, wherein, the distance between any adjacent two of the target materials is 192 mm±10 mm, and the target materials each are rotatable left-right by an angle in a range from 40° to 70° with relative to the substrate.

Further, there are fifteen target materials provided in the vacuum chamber, wherein, the distance between any adjacent two of the target materials is 178 mm±10 mm, and the target materials each are rotatable left-right by an angle in a range from 30° to 60° with relative to the substrate.

Further, an angle, by which the target materials facing to edge areas of the substrate are rotatable left-right with relative to the substrate, is smaller than an angle, by which the rotating magnetic poles in the other target materials are rotatable left-right with relative to the substrate.

Further, a plurality of gas aperture groups for injecting the process gas into inside of the vacuum chamber are provided in vertical columns between any adjacent two of the target materials, in which each of the plurality of gas aperture groups includes a plurality of gas apertures; and, the gas aperture groups, at initiating ends respectively, of two adjacent columns of gas apertures groups are spaced from a tip of the target material by different distances.

Further, the gas aperture groups comprise: a first gas aperture group that includes four gas apertures arranged in a diamond shape and respectively located in upper, lower, left and right corners of the diamond shape; or, a second gas aperture group that includes two gas apertures arranged in a diamond shape and respectively located in left and right corner of the diamond shape.

Further, the gas aperture groups, at the initiating ends respectively, of two adjacent columns of gas aperture groups are respectively the first gas aperture group and the second gas aperture group.

Preferably, the first group of gas aperture at the initiating end is distanced from the tip of the target material by 26 mm±5 mm, and the second group of gas aperture at the initiating end is distanced from the tip of the target material by 20 mm+5 mm.

Further, a distance between two adjacent columns of gas aperture groups is equal to a distance between two adjacent target materials.

Further, projections of the two adjacent columns of gas aperture groups on the same target material are spaced from one another.

Preferably, two adjacent gas aperture groups in the same column of groups of gas apertures are spaced from one another by 442 mm±5 mm.

The sputtering apparatus provided by the present invention includes the vacuum chamber in which a substrate and a plurality of rotatable target materials are provided. Compared with that in prior arts, the sputtering apparatus according to embodiments of the present invention is provided by reducing the distance between any two adjacent target materials to be in a range from 160 mm to 220 mm. As the distance between any two adjacent target materials is reduced and correspondingly an angle, by which the target materials each rotates, is also reduced, difference among distances of travel of particles from one same target material to different positions of the substrate may be decreased such that contents of the process gas at different positions of the film formed by the particles through the sputtering and thus characteristics of the film formed at different positions/locations tend to be uniform, thereby avoiding deterioration or failure of performance of a device including the film and thus increasing yield of devices produced by the sputtering apparatus.

BRIEF DESCRIPTION OF THE DRAWINGS

The accompanying drawings are included to provide a further understanding of the present invention, and constitute a part of this specification. The drawings together with the following detailed embodiments serve to explain the present invention, but are not intended to limit the present invention. In the drawings.

LIST OF REFERENCE SIGNS

10—sputtering apparatus 11—substrate 12—target material 13—a first group of gas apertures 14—second group of gas apertures 15—gas aperture

DETAILED DESCRIPTION OF PREFERRED EMBODIMENTS OF THE INVENTION

A sputtering apparatus according to embodiments of the present invention will be described in detailed with reference to accompanying drawings.

Figure 1:
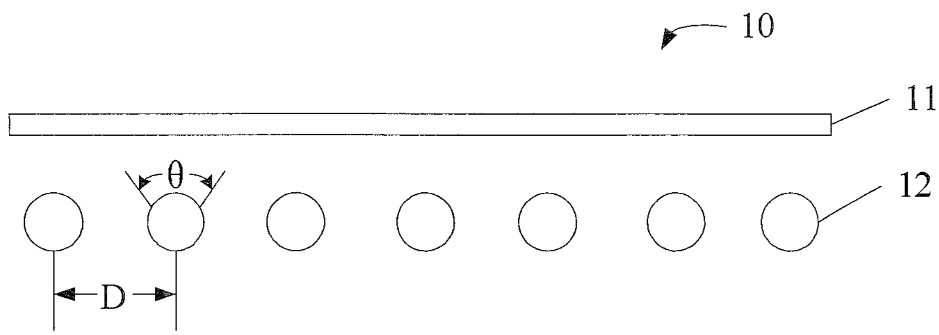
FIG. 1 is a top view I of an interior configuration of a sputtering apparatus according to an embodiment of the present invention.

Referring to FIG. 1, a sputtering apparatus 10 according to an embodiment of the present invention includes a vacuum chamber in which a substrate 11 and a plurality of rotatable target materials 12, facing to the substrate 11, are provided. Any adjacent two of the target materials 12 are spaced from each other by a distance D being in a range from 160 mm to 220 mm, in which the distance D between any adjacent two of the target materials 12 may be adjusted depending on size of the vacuum chamber of the sputtering apparatus. It is noted that the distance between any two adjacent target materials in a same sputtering apparatus may vary and a difference between two different distance values for adjacent target materials should be within a preset threshold range. Preferably, the preset threshold range may be between −10 mm and +10 mm.

Specifically, the sputtering apparatus 10 includes, but not being limited to, a physical vapor deposition apparatus (hereinafter named as PVD apparatus), which will be described by presenting an existing G8.5 PVD apparatus (hereinafter named as G8.5 PVD) in prior arts. In the existing G8.5 PVD, there are twelve target materials 12 and the distance between two adjacent target materials 12 may be about 227.27 mm. By comparison, in the embodiment of the present invention, there are thirteen target materials in G8.5 PVD and the distance between two adjacent target materials 12 may be set to 208 mm±10 mm, namely, in a range from 208 mm−10 mm to 208 mm+10 mm. Alternatively, there are fourteen target materials 12 in G8.5 PVD and the distance between two adjacent target materials 12 may be set to 192 mm±10 mm, namely, in a range from 192 mm−10 mm to 192 mm+10 mm. Alternatively yet, there are fifteen target materials 12 in G8.5PVD and the distance between two adjacent target materials 12 may be set to 178 mm±10 mm, namely, in a range from 178 mm−10 mm to 178 mm+10 mm.

The sputtering apparatus 10 according to embodiments of the present invention includes a vacuum chamber in which a substrate 11 and a plurality of rotatable target materials 12, facing to the substrate 11, are provided. Compared with that in prior arts, the sputtering apparatus 10 according to embodiments of the present invention is configured to have a reduced distance between any adjacent two of the target materials 12, that is, the distance between any adjacent two of the target materials 12 may be in a range from 160 mm to 220 mm. As the distance between two adjacent target materials 12 is reduced, an angle, by which each of the target materials 12 may rotate, becomes smaller. In this instance, during manufacture of the coating, provided that a coating produced by the sputtering apparatus 10 is uniform in thickness, difference among distances of travel of particles from one same target material 12 to different positions of the substrate 11 may be decreased such that contents of the process gas at different positions of the film formed by the particles through the sputtering and thus characteristics of the film formed at different positions/locations tend to be uniform, thereby avoiding deterioration or failure of performance of a device including the film and thus increasing yield of devices produced by the sputtering apparatus 10.

Further, the target materials 12 may be hollow target materials, and, a rotating magnetic pole, which allows the target material to rotate left-right by an angle θ in a range from 30° to 80° with relative to the substrate 11, is provided in central region of each of the target materials 12. The angle θ for rotating of the rotating magnetic pole with relative to the substrate 11 is an angle for rotating of the target material, where the rotating magnetic pole is located, with relative to the substrate 11. By considering the distance between any two adjacent target materials in combination with the angle of the rotating magnetic pole rotating left-right with relative to the substrate 11, it may further ensure uniformity and stability of contents of the process gas at different positions of the film formed by the particles through the sputtering. The sputtering apparatus according to the present invention will be compared with that in the prior arts as follows.

Figure 2:
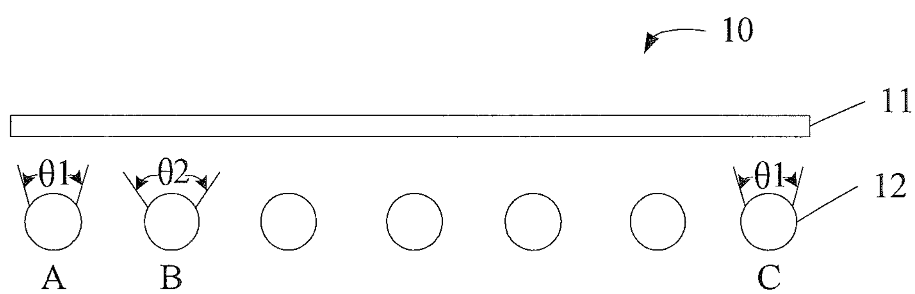
FIG. 2 is a top view II of an interior configuration of a sputtering apparatus according to the embodiment of the present invention.
Figure 2A:
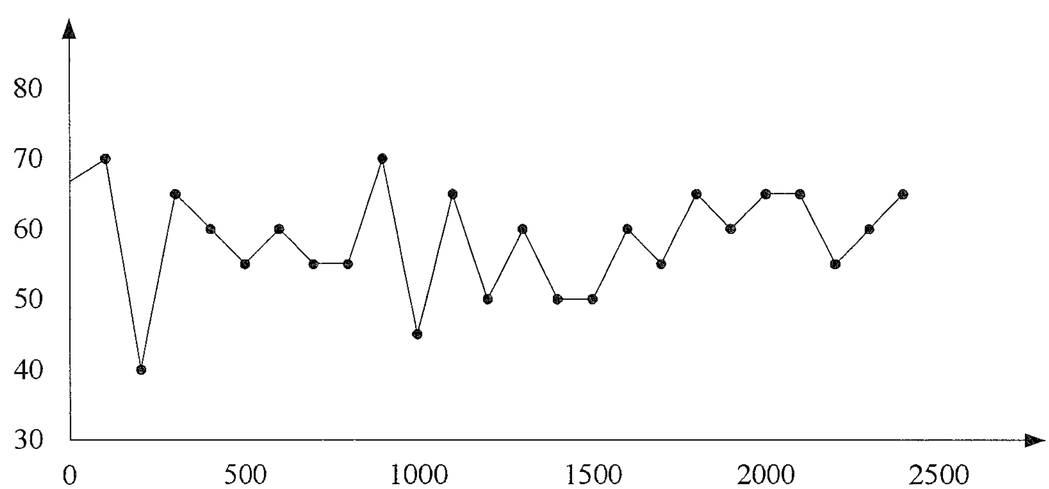
FIG. 2*a* is a relationship diagram reflecting content of a process gas in a film manufactured in prior arts depending on locations of the film.

For example, in a prior art G8.5 PVD, there are twelve target materials and the distance between two adjacent target materials is about 227.27 mm and an angle of the rotating magnetic pole in each target material that rotates left-right with relative to a substrate has a minimum greater than 30° and a maximum greater than 80°, as shown in FIG. 2*a*. FIG. 2*a* shows content of a process gas in a coating manufactured in prior arts depending on locations of the coating, in which the longitudinal axis represents unit content of the process gas and the transverse axis represents locations of the film. As shown in FIG. 2*a*, the broken line has a large fluctuation and the most difference value of the unit content of the process gas at different locations of the film is up to 30, that is, content of the process gas of the film manufactured in prior arts is uneven at different locations.

Figure 2B:
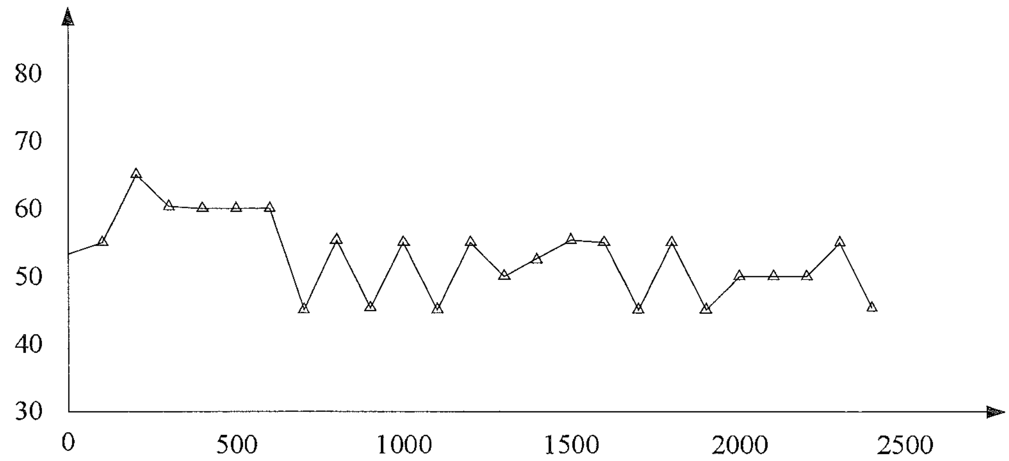
FIGS. 2*b*, 2*c* and 2*d* are relationship diagrams reflecting content of a process gas in a film manufactured in embodiments of the present invention depending on locations of the film.

According to an embodiment of the present invention, there are thirteen target materials 12 in a G8.5 PVD and a distance between two adjacent target materials 12 is set to 208 mm±10 mm, namely, in a range from 208 mm−10 mm to 208 mm+10 mm, and an angle θ by which the rotating magnetic pole in each target material 12 may rotate left-right with relative to the substrate 11 is in a range from 50° to 80°, as shown in FIG. 2*b*. FIG. 2*b* shows a relationship of content of a process gas in a coating formed according to the embodiment of the present invention depending on locations of the film, in which representations of its longitudinal axis and transverse axis are similar to those in FIG. 2*a*. Compared with FIG. 2*a*, broken line in FIG. 2*b* has a reduced fluctuation and the most difference value of the unit content of the process gas at different locations of the film is up to 20. It can be learned that, compared with the prior arts, the content of the process gas in the film according to the embodiment of the present invention has an improved uniformity and evenly tends to be much more uniform at different locations.

Figure 2C:
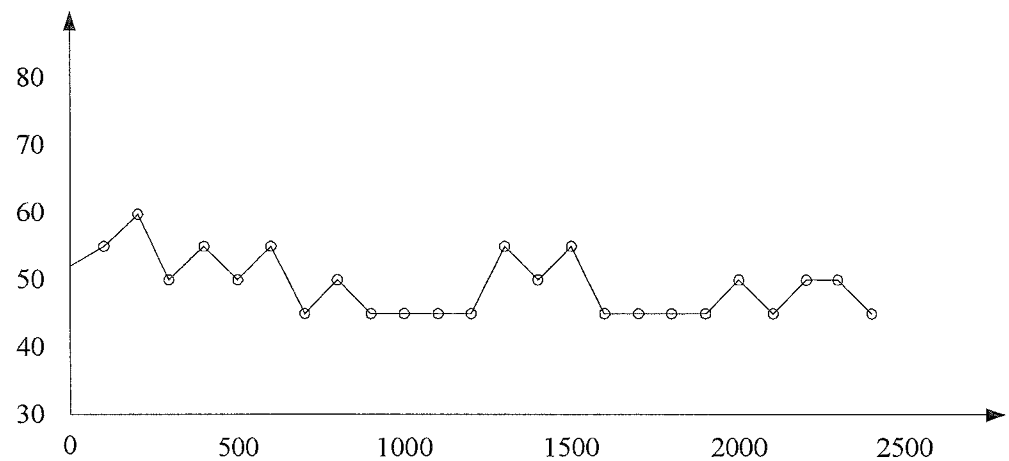

Alternatively, in an embodiment of the present invention, there are fourteen target materials 12 in a G8.5 PVD and the distance between two adjacent target materials 12 is set to 192 mm±10 mm, namely, in a range from 192 mm−10 mm to 192 mm+10 mm, and an angle θ by which the rotating magnetic pole in each target material 12 may rotate left-right with relative to the substrate 11 is in a range from 40° to 70°, as shown in FIG. 2*c*. FIG. 2*c* shows a relationship of content of a process gas in a coating formed according to the embodiment of the present invention depending on locations of the film, in which representations of its longitudinal axis and transverse axis are similar to those in FIG. 2*a*. Compared with FIG. 2*a*, broken line in FIG. 2*c* has a reduced fluctuation and the most difference value of the unit content of the process gas at different locations of the film is up to 15. It can be learned that, compared with the prior arts, the content of the process gas in the film according to the embodiment of the present invention has an improved uniformity and even tends to be much more uniform at different locations.

Figure 2D:
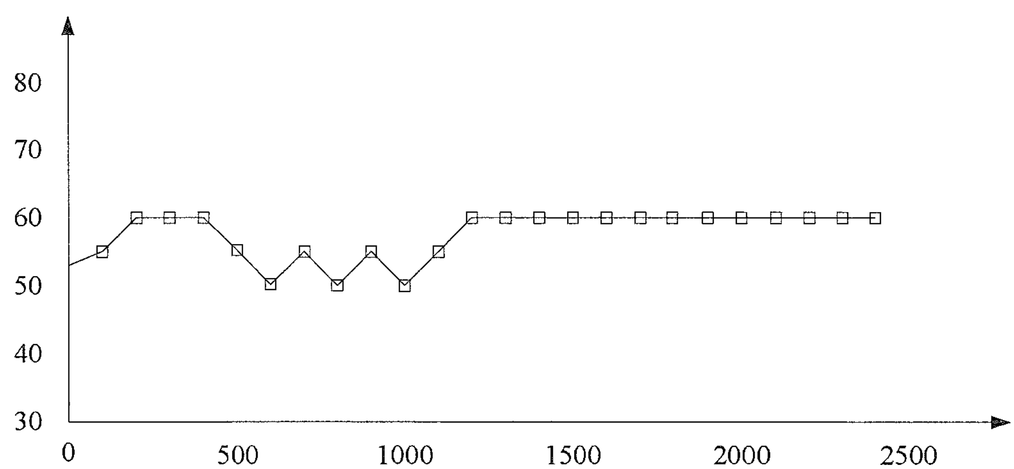

Alternatively, in an embodiment of the present invention, there are fifteen target materials 12 in a G8.5 PVD and the distance between two adjacent target materials 12 is set to 178 mm±10 mm, namely, in a range from 178 mm−10 mm to 178 mm+10 mm, and an angle θ by which the rotating magnetic pole in each target material 12 may rotate left-right with relative to the substrate 11 is in a range from 30° to 60°, as shown in FIG. 2*d*. FIG. 2*d* shows a relationship of content of a process gas in a coating formed according to the embodiment of the present invention depending on locations of the film, in which representations of its longitudinal axis and transverse axis are similar to those in FIG. 2*a*. Compared with FIG. 2*a*, broken line in FIG. 2*d* has a reduced fluctuation and the most difference value of the unit content of the process gas at different locations of the film is up to 10. It can be learned that, compared with the prior arts, the content of the process gas in the film according to the embodiment of the present invention has an improved uniformity and even tends to be much more uniform at different locations.

In order to improve uniformity in thickness throughout the manufactured film, an angle, by which the rotating magnetic poles in the target materials 12 facing to edge areas of the substrate 11 are rotatable left-right with respect to the substrate 11, is smaller than an angle, by which the rotating magnetic poles in the other target materials 12 are rotatable left-right with respect to the substrate 11. For example, referring to FIG. 2, the target materials A and C represent the target materials facing to the edge areas of the substrate 11. The angles, by which the rotating magnetic poles in the target materials A and C are rotatable left-right with respect to the substrate are both θ1, and the angle, by which the rotating magnetic poles in the target materials B are rotatable left-right with respect to the substrate is θ2, in which θ2 is greater than θ1, namely, θ2>θ1.

Figure 3:
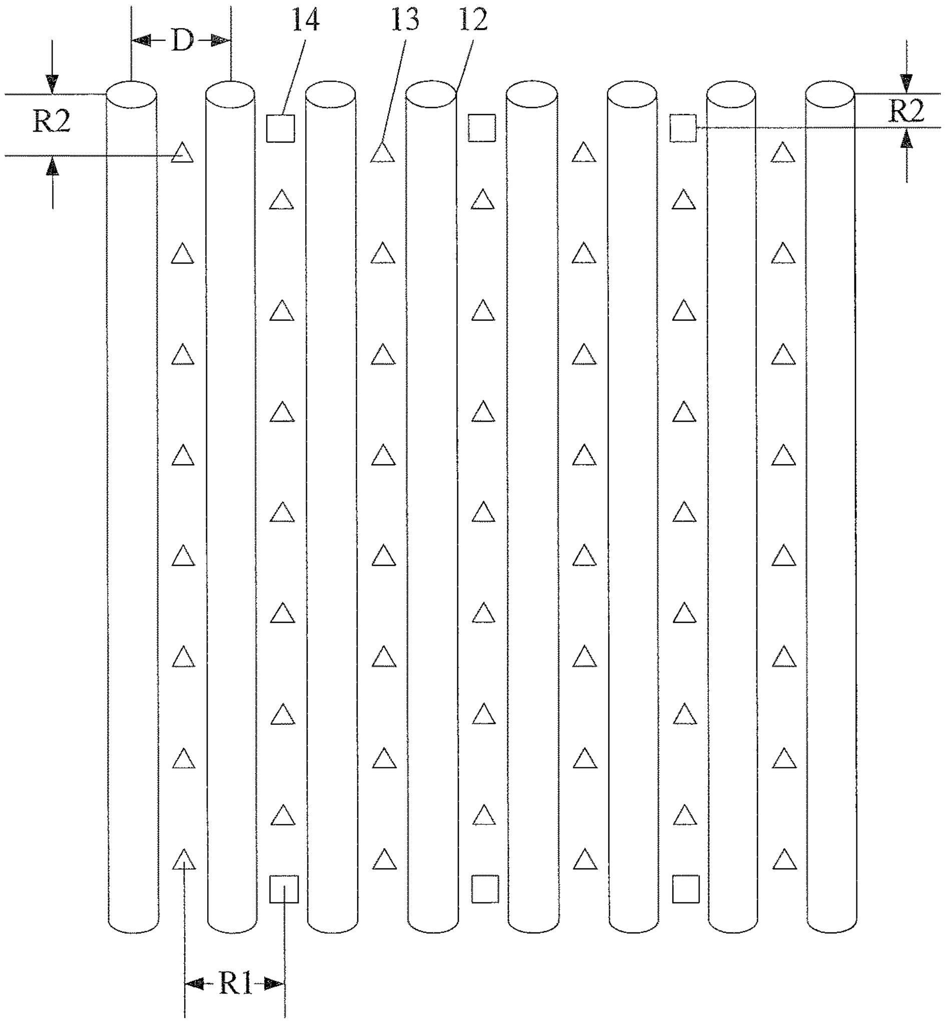
FIG. 3 is a schematic configuration view of distribution of gas aperture groups in the sputtering apparatus according to an embodiment of the present invention.

In order to achieve a much more uniform distribution of the process gas in the vacuum chamber so as to obtain uniform distribution of contents of the process gas in the film manufactured, an improvement of distribution of gas apertures 15 in the sputtering apparatus 10 is also made according to embodiments of the present invention. Referring to FIG. 3, a plurality of gas aperture groups for injecting the process gas into inside of the vacuum chamber are provided in vertical columns between any two adjacent target materials 12. For example, as shown in FIG. 3, there are eight target materials 12 in the vacuum chamber of the sputtering apparatus 10, and one column of the gas aperture groups is between any two adjacent target materials 12. There are seven columns of gas aperture groups in the vacuum chamber, in which each of the group of gas apertures includes a plurality of gas apertures 15. Further, the gas aperture groups, at initiating ends respectively, of two adjacent columns of the gas aperture groups are spaced from a tip of the target material by different distances. For example, as shown in FIG. 3, the group of gas apertures, at initiating ends, in the first column of the gas aperture groups is spaced to the tip of the target material by a distance R2, and the group of gas apertures, at initiating ends, of the second column of the gas aperture groups is spaced to the tip of the target material by a distance R3, in which R2 is different from R3, namely, R2≠R3. With this configuration of the gas aperture groups corresponding to edge areas of the substrate 11, the process gas, which has been injected through the gas aperture groups into the vacuum chamber, is distributed at locations corresponding to edge areas of the substrate 11 in a much more uniform manner.

Figure 4:
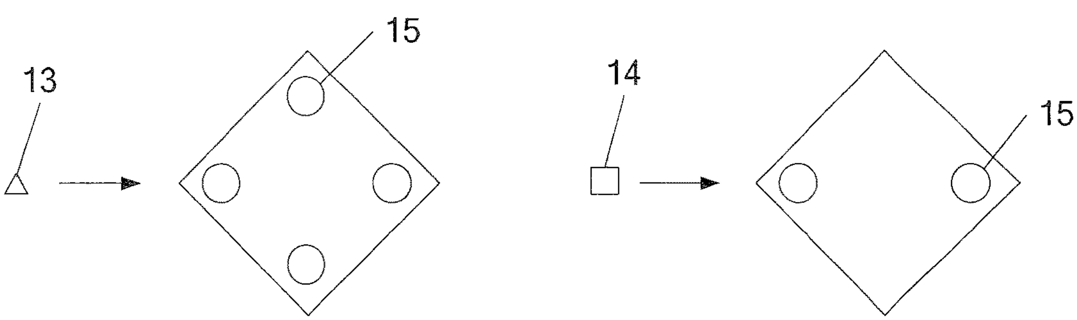
FIG. 4 is a schematic configuration view of a first gas aperture group and a second gas aperture group in an embodiment of the present invention.

The gas aperture groups may include a first gas aperture group 13 or a second gas aperture group 14, which is grouped according to arrangement of the gas aperture 15 in a gas aperture group in position. Referring to FIG. 4, the first gas aperture group 13 includes four gas apertures 15, which are arranged in a diamond shape and are respectively located in upper, lower, left and right corners of the diamond shape, and the second gas aperture group 14 includes two gas apertures 15, which are arranged in a diamond shape and are respectively located in left and right corners of the diamond shape. With this configuration of the gas apertures 15 in the gas aperture group, the distribution of the process gas in the vacuum chamber is improved to be in a much more uniform manner, so as to allow the distribution of the process gas in the film to be in a much more uniform manner, thereby further improving yield of the devices manufactured by the sputtering apparatus 10.

Further, in order to improve uniformity of the process gas in the vacuum chamber, the gas aperture groups, at initiating ends, of two adjacent columns of gas aperture groups may be respectively the first gas aperture group 13 and the second gas aperture group 14, as shown in FIG. 3. For example, there are eight target materials 12 in the vacuum chamber of the sputtering apparatus 10, and the gas aperture group at the initiating end, of the first column of the gas aperture group between the first target material 12 and the second target material 12 is the first gas aperture group 13 and the gas aperture group at the initiating end of the second column of the gas aperture group between the second target material 12 and the third target material 12 is the second gas aperture group 14. Preferably, the first gas aperture 13 at the initiating end is spaced to the tip of the target material by 26 mm±5 mm, that is, R2=26 mm±5 mm; and the second gas aperture 13 at the initiating end is spaced to the tip of the target material by 20 mm±5 mm, that is, R3=20 mm±5 mm.

It is noted that, the distance between two adjacent columns of gas aperture groups is similar to the distance between two adjacent target materials 12. As shown in FIG. 3, a distance R1 between two adjacent columns of gas aperture groups is the same as a distance D between two adjacent target materials 12, i.e., R1=D.

In order to further improve uniformity of the process gas in the vacuum chamber, projections of two adjacent columns of gas aperture groups on the same target material 12 are spaced from one another, as shown in FIG. 3. The first gas aperture group of the first column of gas aperture groups and the first and second gas aperture groups of the second column of gas aperture groups are not located in a horizontal level. The projections of the first column of gas aperture groups on the second target material along a horizontal direction and the projections of the second column of gas aperture groups on the second target material along the horizontal direction are spaced from one another.

In the embodiment, for giving consideration to the uniformity of the process gas in the vacuum chamber and the number of the gas apertures, preferably, the distance between two adjacent gas aperture groups in the same column may be set to 442 mm±5 mm, namely, in a range from 442 mm+5 mm to 442 mm−5 mm. For example, as shown in FIG. 3, the distance between the first group of gas apertures and the second group of gas apertures in the first column of groups of gas aperture is set to 442 mm+5 mm.

Figure 5:
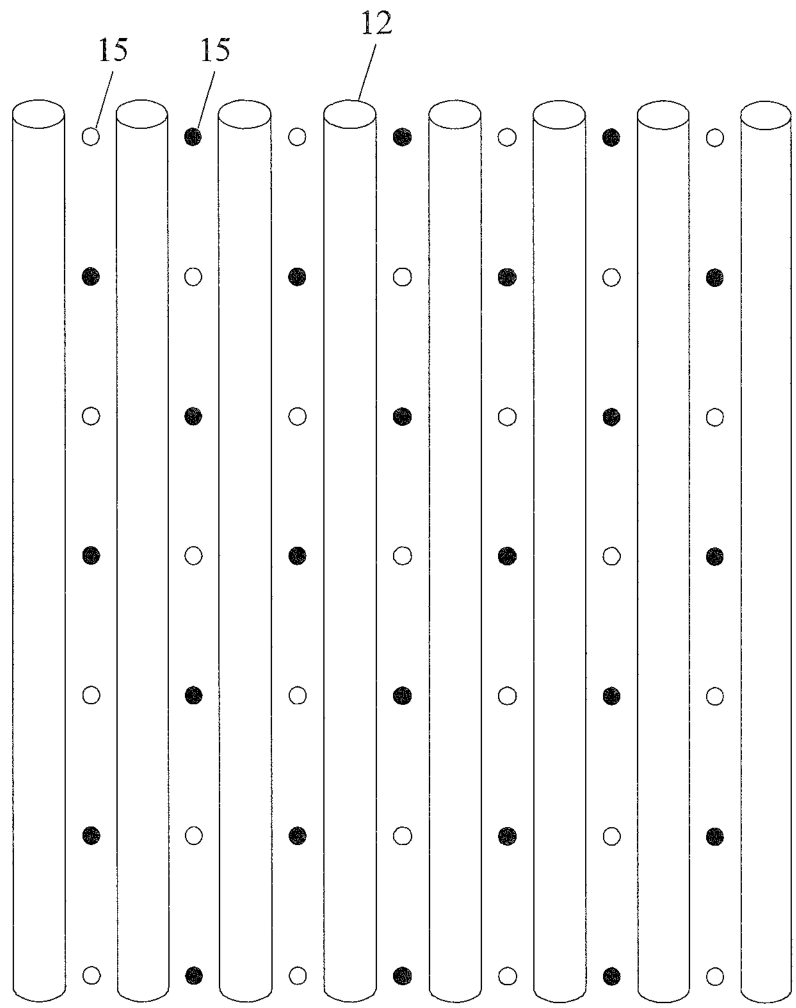
FIG. 5 is a schematic configuration view of distribution of gas apertures in the sputtering apparatus according to an embodiment of the present invention.

It is noted that the embodiments of the present invention may include the prior art gas apertures 15, which are arranged in column, and some of the gas apertures 15 are used to injection of the process gas to the vacuum chamber. Preferably, for the gas apertures 15 in the two adjacent columns of gas apertures, projections of the gas apertures 15 through which the process gas is injected to the vacuum chamber onto the same target material are spaced from one another. For example, as shown in FIG. 5, solid circles and hollow circles both represent the gas apertures 15, in which the solid circles represent the gas apertures 15 through which the process gas is injected to the vacuum chamber while the hollow circles represent the gas apertures 15 through which no gas is injected to the vacuum chamber. With the above configuration, under the condition where the prior art arrangement of the gas apertures 15 is maintained, the uniformity of the process gas in the vacuum chamber may be improved.

In these above embodiments, specific characteristics, structures, materials or other features may be combined in suitable manner in any other one or more embodiment(s).

For example, according to an embodiment of the present invention, the sputtering apparatus may be configured such that injections of the process gas into the vacuum chamber are performed at some of the gas apertures. Preferably, projections of the gas apertures 15, in two adjacent columns of gas apertures 15, through which the process gas is injected to the vacuum chamber, on any one of the target materials are spaced from one another. For example, as shown in FIG. 5, the solid circles and the hollow circles 15 both are gas apertures 15, in which the solid circles represent the gas apertures 15 through which the process gas is injected to the vacuum chamber while the hollow circles represent the gas apertures 15 through which no gas is injected to the vacuum chamber. The above configuration with the gas apertures 15 arranged in the sputtering apparatus according to the embodiments of the present invention, may further improve uniformity of the process gas in the vacuum chamber.

The above embodiments are only used to explain the present invention, and should not be construed to limit the present invention. It will be understood by those skilled in the art that various changes and modifications may be made therein without departing from the spirit of the present invention, the scope of which is defined in the appended claims.

What is claimed is:

1. A sputtering apparatus comprising: a vacuum chamber in which a substrate and a plurality of rotatable target materials facing to the substrate are provided, wherein a distance between any adjacent two of the target materials is in a range from 160 mm to 220 mm;

the sputtering apparatus further comprises a plurality of gas aperture groups for injecting the process gas into inside of the vacuum chamber are provided in vertical columns between any adjacent two of the target materials, in which each of the plurality of gas aperture groups includes a plurality of gas apertures; and, the gas aperture groups, at initiating ends respectively, of two adjacent columns of gas apertures groups are spaced from a tip of the target material by different distances, wherein tips of the plurality of rotatable target materials are disposed at a same level;

wherein the plurality of gas aperture groups comprise: a first gas aperture group that includes four gas apertures arranged in a diamond shape and respectively located in upper, lower, left and right corners of the diamond shape; or, a second gas aperture group that includes two gas apertures arranged in a diamond shape and respectively located in left and right corner of the diamond shape; a plurality of regions are included between two, adjacent to each other, of the target materials and an area where no gas aperture is provided is included between two of the gas aperture groups, such that the gas aperture groups are separated from one another along a direction in which the target materials extend.

2. The sputtering apparatus according to claim 1, wherein the target materials are hollow target materials, and, a rotating magnetic pole, which allows each of the target materials to rotate left-right by an angle in a range from 30° to 80° with respect to the substrate, is provided in a central region of each of the target materials.

3. The sputtering apparatus according to claim 1, wherein there are thirteen target materials provided in the vacuum chamber, wherein, the distance between any adjacent two of the target materials is 208 mm±10 mm, and the target materials each are rotatable left-right by an angle in a range from 50° to 80° with relative to the substrate.

4. The sputtering apparatus according to claim 1, wherein there are fourteen target materials provided in the vacuum chamber, wherein, the distance between any adjacent two of the target materials is 192 mm±10 mm, and the target materials each are rotatable left-right by an angle in a range from 40° to 70° with relative to the substrate.

5. The sputtering apparatus according to claim 1, wherein there are fifteen target materials provided in the vacuum chamber, wherein, the distance between any adjacent two of the target materials is 178 mm±10 mm, and the target materials each are rotatable left-right by an angle in a range from 30° to 60° with relative to the substrate.

6. The sputtering apparatus according to claim 2, wherein an angle, by which the target materials facing to edge areas of the substrate are rotatable left-right with relative to the substrate, is smaller than an angle, by which the other target materials are rotatable left-right with relative to the substrate.

7. The sputtering apparatus according to claim 1, wherein the gas aperture groups, at the initiating ends respectively, of two adjacent columns of gas aperture groups are respectively the first gas aperture group and the second gas aperture group.

8. The sputtering apparatus according to claim 7, wherein the first gas aperture group at the initiating end is distanced from the tip of the target material by 26 mm±5 mm, and the second gas aperture group at the initiating end is distanced from the tip of the target material by 20 mm±5 mm.

9. The sputtering apparatus according to claim 1, wherein a distance between two adjacent columns of gas aperture groups is equal to a distance between two adjacent target materials.

10. The sputtering apparatus according to claim 7, wherein projections of the two adjacent columns of gas aperture groups on the same target material are spaced from one another.

11. The sputtering apparatus according to claim 1, wherein two adjacent gas aperture groups in the same column of gas aperture group are spaced from one another by 442 mm±5 mm.

12. The sputtering apparatus according to claim 1, wherein the sputtering apparatus is configured to control gas injections of the plurality of gas apertures such that the gas injections are performed at some of the plurality of gas apertures while are not being performed at the rest of the gas apertures, so as to control a uniform distribution of the process gas.

13. The sputtering apparatus according to claim 12, wherein the sputtering apparatus is configured to control gas injections of the plurality of gas apertures such that the gas apertures where the process gas is injected are spaced from one another.

14. The sputtering apparatus according to claim 2, wherein there are thirteen target materials provided in the vacuum chamber, wherein, the distance between any adjacent two of the target materials is 208 mm±10 mm, and the target materials each are rotatable left-right by an angle in a range from 50° to 80° with relative to the substrate.

15. The sputtering apparatus according to claim 2, wherein there are fourteen target materials provided in the vacuum chamber, wherein, the distance between any adjacent two of the target materials is 192 mm±10 mm, and the target materials each are rotatable left-right by an angle in a range from 40° to 70° with relative to the substrate.

16. The sputtering apparatus according to claim 2, wherein there are fifteen target materials provided in the vacuum chamber, wherein, the distance between any adjacent two of the target materials is 178 mm±10 mm, and the target materials each are rotatable left-right by an angle in a range from 30° to 60° with relative to the substrate.

* * * * *